United States Patent
Cox, Jr. et al.

(10) Patent No.: US 9,043,586 B2
(45) Date of Patent: May 26, 2015

(54) MEMORY TRAINING RESULTS CORRESPONDING TO A PLURALITY OF MEMORY MODULES

(75) Inventors: William H. Cox, Jr., Morrisville, NC (US); Jimmy G. Foster, Sr., Morrisville, NC (US); Sumeet Kochar, Apex, NC (US); Ivan R. Zapata, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 627 days.

(21) Appl. No.: 13/332,092

(22) Filed: Dec. 20, 2011

(65) Prior Publication Data

US 2013/0159687 A1    Jun. 20, 2013

(51) Int. Cl.
G06F 9/00    (2006.01)
G06F 13/00    (2006.01)
G06F 12/06    (2006.01)

(52) U.S. Cl.
CPC .................................. G06F 12/0646 (2013.01)

(58) Field of Classification Search
USPC ............ 713/1, 2; 345/522; 711/103, E12.001
See application file for complete search history.

(56) References Cited

U.S. PATENT DOCUMENTS

| | | |
|---|---|---|
| 6,282,702 B1 | 8/2001 | Ungar |
| 6,321,323 B1 | 11/2001 | Nugroho et al. |
| 6,345,212 B1 | 2/2002 | Nourse |
| 7,392,344 B2 | 6/2008 | Pribbernow et al. |
| 7,543,118 B1 | 6/2009 | Chen et al. |
| 2009/0037909 A1 | 2/2009 | Xu |
| 2009/0244997 A1 | 10/2009 | Searles et al. |

FOREIGN PATENT DOCUMENTS

JP        2000330464 A    11/2000

OTHER PUBLICATIONS

Wikipedia, "Monte Carlo Method", www.wikipedia.org, [URL: http://en.wikipedia.org/wiki/Monte_Carlo_method] [accessed online Jun. 29, 2011].

*Primary Examiner* — Zahid Choudhury
(74) *Attorney, Agent, or Firm* — Edward J. Lenart; Katherine S. Brown; Biggers Kennedy Lenart Spraggins LLP

(57) ABSTRACT

Methods, apparatuses, and computer program products for improving memory training results corresponding to a plurality of memory modules are provided. Embodiments include detecting a hardware configuration change upon initiating a boot sequence of a system that includes the plurality of memory modules; generating for a plurality of training iterations, reference training values corresponding to aligning of a data strobe (DQS) signal with a data valid window of data (DQ) lines of the plurality of memory modules; identifying for each training iteration, any outer values within the reference training values generated for that training iteration; eliminating the identified outer values from the reference training values; generating a final reference training value based on an average of the remaining reference training values; and using the final reference training value as the DQ-DQS timing value for the boot sequence of the system.

19 Claims, 6 Drawing Sheets

MEMORY TRAINING RESULTS CORRESPONDING TO A PLURALITY OF MEMORY MODULES

BACKGROUND OF THE INVENTION

1. Field of the Invention

The field of the invention is data processing, or, more specifically, methods, apparatuses, and computer program products for improving memory training results corresponding to a plurality of memory modules.

2. Description of Related Art

There are many types of memory. One type is referred to as dynamic random access memory (DRAM). A DRAM system can include several know types of DRAM, of which double data rate (DDR) is an example. During a read operation, DDR DRAM will issue a data (DQ) signal and a data strobe (DQS) signal at the same time. In order for the DRAM controller to correctly acquire the data being sent from the DDR DRAM, the DRAM controller typically utilizes a delay-locked loop (DLL) circuit to delay the DQS signal so that it can be used to correctly latch the DQ signals. In order for the DQS signal to be properly aligned with a data valid window of DQ lines, vendors use a training program to generate timing values corresponding to the DQS-DQ alignment. However, variables introduced by installation of the memory modules on a particular platform may impact alignment of the DQS signal with the DQ lines. As a consequence, in some instances, memory modules installed in a platform have failed to pass initialization when the platform was experiencing one or more of the variables. Failure to pass initialization may result in post ship support calls from vendors which results in loss of user function and cost to both the user and the vendors.

SUMMARY OF THE INVENTION

Methods, apparatuses, and computer program products for improving memory training results corresponding to a plurality of memory modules are provided. Embodiments include detecting, by a training controller, a hardware configuration change upon initiating a boot sequence of a system that includes the plurality of memory modules; generating for a plurality of training iterations, by the training controller, reference training values corresponding to aligning of a data strobe (DQS) signal with a data valid window of data (DQ) lines of the plurality of memory modules; identifying for each training iteration, by the training controller, any outer values within the reference training values generated for that training iteration; eliminating, by the training controller, the identified outer values from the reference training values; generating, by the training controller, a final reference training value based on an average of the remaining reference training values; and using, by the training controller, the final reference training value as the DQ-DQS timing value for the boot sequence of the system.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
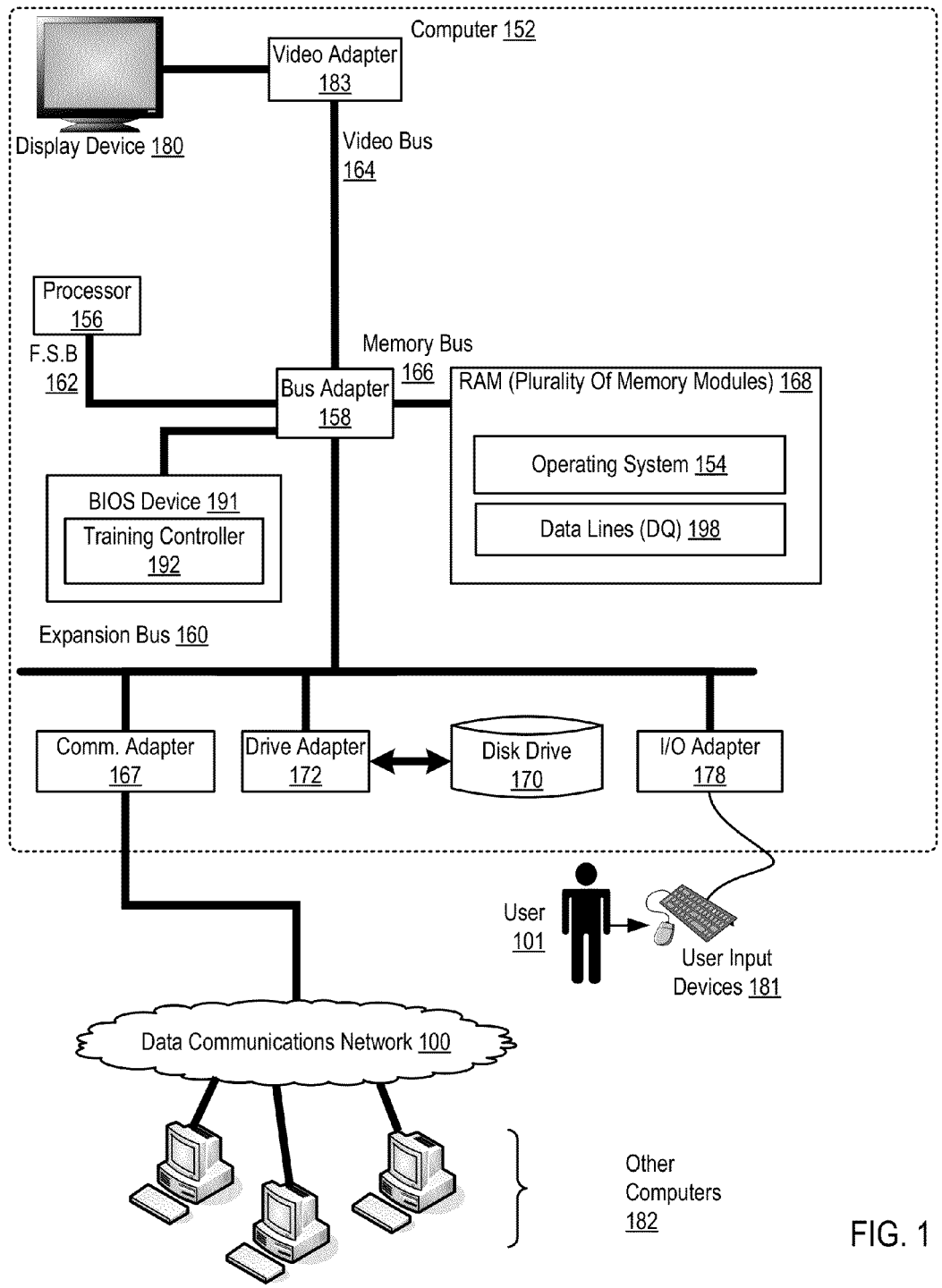
FIG. 1 sets forth a block diagram of automated computing machinery comprising an exemplary computer useful in improving memory training results corresponding to a plurality of memory modules according to embodiments of the present invention.

Exemplary methods, apparatuses, and computer program products for improving memory training results corresponding to a plurality of memory modules in accordance with the present invention are described with reference to the accompanying drawings, beginning with FIG. 1. Improving memory training results corresponding to a plurality of memory modules in accordance with the present invention is generally implemented with computers, that is, with automated computing machinery. FIG. 1 sets forth a block diagram of automated computing machinery comprising an exemplary computer (152) useful in improving memory training results corresponding to a plurality of memory modules according to embodiments of the present invention. The computer (152) of FIG. 1 includes at least one computer processor (156) or 'CPU' as well as random access memory comprising a plurality of memory modules (168) ('RAM') which is connected through a high speed memory bus (166) and bus adapter (158) to processor (156) and to other components of the computer (152).

The computer (152) includes a BIOS device (191) that is used to provide computer program instructions to the processor (156) during a boot sequence. In the example of FIG. 1, the BIOS device (191) includes a training controller (192) that includes computer program instructions that when executed by the computer processor (156) cause the computer to carry out the steps of: detecting a hardware configuration change upon initiating a boot sequence of the computer (152); and generating for a plurality of training iterations reference training values corresponding to aligning of a data strobe (DQS) signal with a data valid window of data (DQ) lines of the plurality of memory modules. In the example of FIG. 1, the memory modules (168) use a distributed queuing system (DQS) (clock) signal driven coincident with a Data Queuing (DQ) (data) over data lines (198) for data returning from the memory modules (168) to a memory controller. A typical design delays the DQS clock signal by a half of a bit time and uses this delayed DQS signal to clock the data in the first stage of a control chip. For a proper memory read operation to be performed at the memory modules (168), the data strobes (DQS) signals must be properly timed to align with a data valid window of the data (DQ) lines (198). The data valid window refers to the specific period of time when the memory modules drive (makes active) the DQ lines for the memory controller to read its data. The DQ-DQS timing value is the value that is used to calculate delay with respect to a device reference clock and is used to center the DQS signal in the data valid window. This DQ-DQS timing may be set by a motherboard designer. However, according to embodiments of the present invention, the DQ-DQS timing is determined by generating reference training values during a number of iterations, each of which measures timing with different platform variation.

The training controller (192) also includes computer program instructions that when executed by the computer processor (156) cause the computer to carry out the steps of: identifying for each training iteration any outer values within the reference training values generated for that training iteration; eliminating the identified outer values from the reference training values; generating a final reference training value based on an average of the remaining reference training values; and using the final reference training value as the DQ-DQS timing value for the boot sequence of the system. By taking into account platform variation in the training of memory and eliminating the outer values of the reference training values before determining the DQ-DQS timing value, the present invention improves the memory training results corresponding to the plurality of memory modules (168).

Stored in RAM (168) is an operating system (154). Operating systems useful for improving memory training results corresponding to a plurality of memory modules according to embodiments of the present invention include UNIX™, Linux™, Microsoft XP™, AIX™, IBM's i5/OS™, and others as will occur to those of skill in the art. The operating system (154) and the configuration optimizer (191) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for improving memory training results corresponding to a plurality of memory modules according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (183), which is an example of an I/O adapter specially designed for graphic output to a display device (180) such as a display screen or computer monitor. Video adapter (183) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for improving memory training results corresponding to a plurality of memory modules according to embodiments of the present invention include modems for wired dial-up communications, Ethernet (IEEE 802.3) adapters for wired data communications network communications, and 802.11 adapters for wireless data communications network communications.

Figure 2:
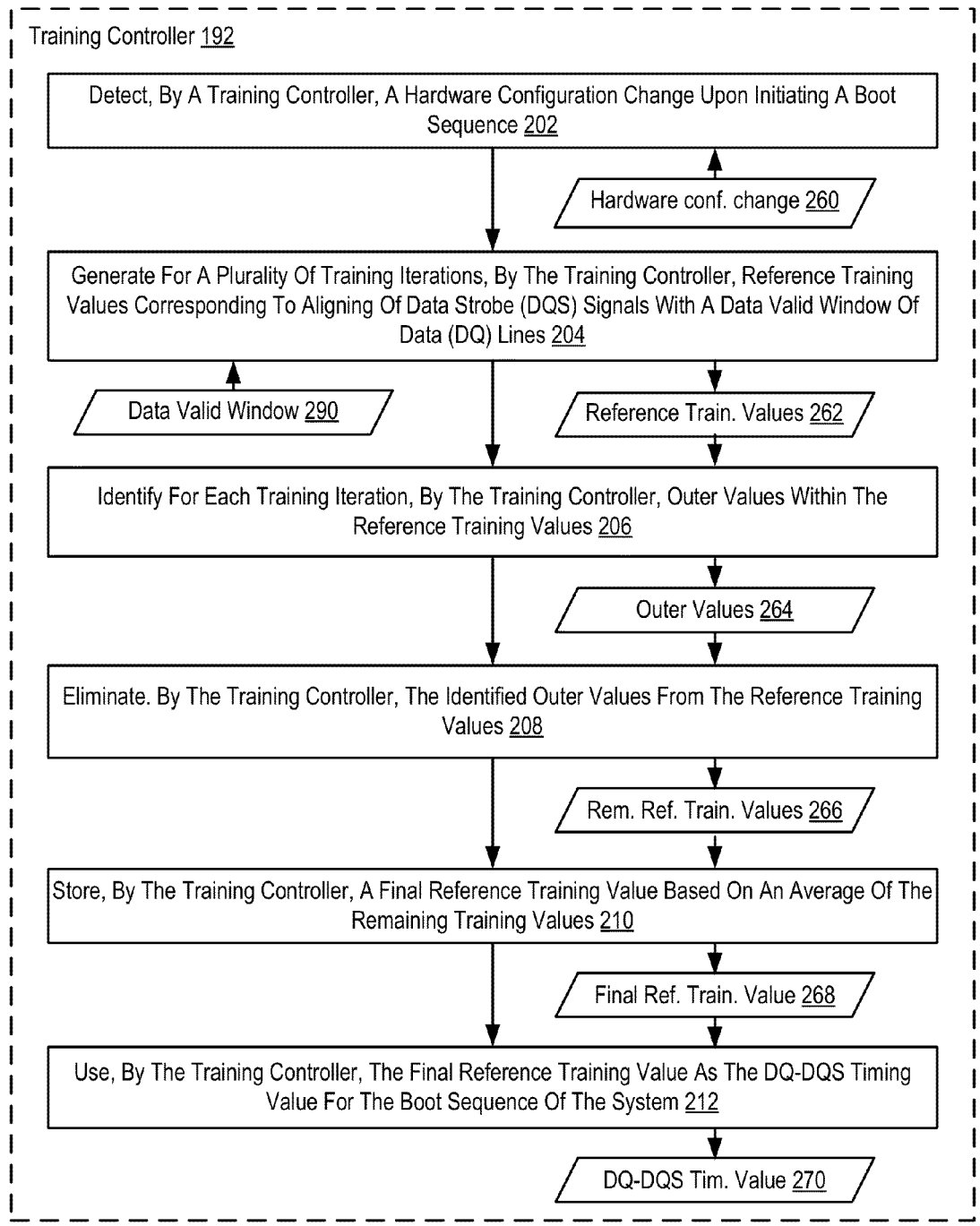
FIG. 2 sets forth a flow chart illustrating an exemplary method for improving memory training results corresponding to a plurality of memory modules according to embodiments of the present invention.

FIG. 2 sets forth a flow chart illustrating an exemplary method for improving memory training results corresponding to a plurality of memory modules according to embodiments of the present invention. The method of FIG. 2 includes detecting (202), by a training controller (192), a hardware configuration change (260) upon initiating a boot sequence of a system (152) that includes the plurality of memory modules (168). A hardware configuration change may indicate the addition of one or more components to a system. Examples of hardware configuration changes include the addition or removal of a processor, disk drive, memory modules, I/O adapters, drive adapters, video adapters, and many others as will occur to one of skill in the art. Detecting (202), by a training controller (192), a hardware configuration change (260) upon initiating a boot sequence of a system (152) that includes the plurality of memory modules (168) may be carried out by reading one or more configuration files within the BIOS device where the configuration files indicate changes to the hardware of the system. For example, a particular configuration file may indicate that one or more memory modules have been added.

The method of FIG. 2 also includes generating (204) for a plurality of training iterations, by the training controller (192), reference training values (262) corresponding to aligning of a data strobe (DQS) signal with a data valid window (290) of data (DQ) lines (198) of the plurality of memory modules (168). The data valid window refers to the specific period of time when the memory modules (168) drives (makes active) the DQ lines (198) for a memory controller to read data in the memory modules (168). A reference training value is a value indicating a timing of a DQS signal with a DQ line. Generating (204) for a plurality of training iterations, by the training controller (192), reference training values (262) corresponding to aligning of a data strobe (DQS) signal with a data valid window (290) of data (DQ) lines (198) of the plurality of memory modules (198) may be carried out by receiving a plurality of DQS signals and a plurality of DQ signals; and comparing when the DQS signals are received relative to the corresponding DQ signals.

The method of FIG. 2 includes identifying (206) for each training iteration, by the training controller (192), any outer values (264) within the reference training values (262) generated for that training iteration. An outer value is a value that is higher or lower than timing values normally generated during a training iteration. Identifying (206) for each training iteration, by the training controller (192), any outer values (264) within the reference training values (262) generated for that training iteration may be carried out by determining the highest and lowest reference training values; and storing the determined highest and lowest reference training values as the outer values.

The method of FIG. 2 includes eliminating (208), by the training controller (192), the identified outer values from the reference training values. Eliminating (208), by the training controller (192), the identified outer values from the reference training values may be carried out by deleting the identified outer values from the reference training values.

The method of FIG. 2 also includes generating (210), by the training controller (192), a final reference training value (268) based on an average of the remaining reference training values (266). Generating (210), by the training controller (192), a final reference training value (268) based on an average of the remaining reference training values (268) may be carried out by determining an average of the remaining reference training values and storing the average as the final reference training value.

The method of FIG. 2 includes using (212), by the training controller (212), the final reference training value (268) as the DQ-DQS timing value (270) for the boot sequence of the system (152). The DQ-DQS timing value is the value that is used to calculate delay with respect to a device reference clock and is used to center the DQS signal in the data valid window. Using (212), by the training controller (212), the final reference training value (268) as the DQ-DQS timing value (270) for the boot sequence of the system (152) may be carried out by using the DQ-DQS timing value (270) to set a delay-locked loop that controls the read operation of the one or more of the memory modules (168).

Figure 3:
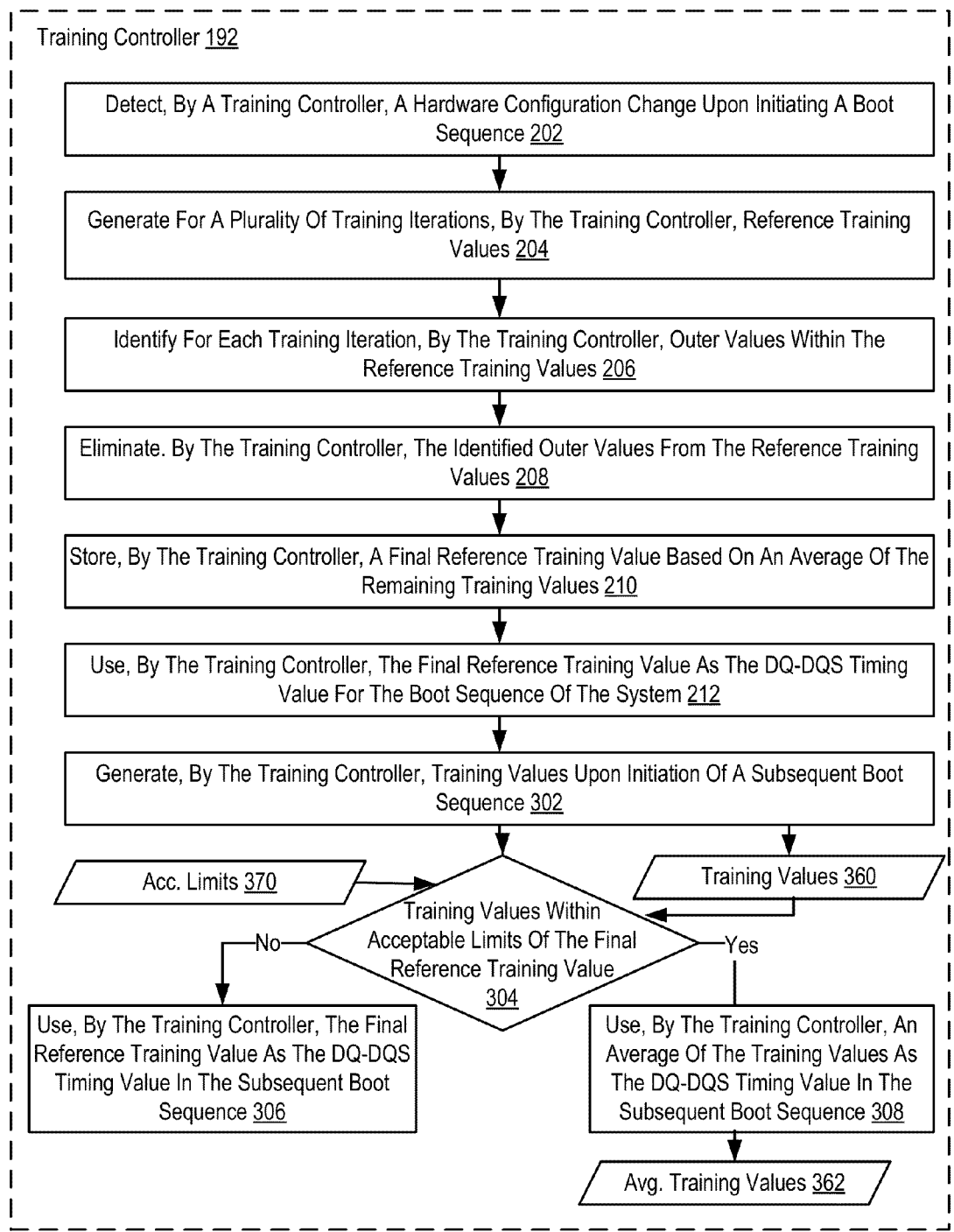
FIG. 3 sets forth a flow chart illustrating a further exemplary method for improving memory training results corresponding to a plurality of memory modules according to embodiments of the present invention.

FIG. 3 sets forth a flow chart illustrating a further exemplary method for improving memory training results corresponding to a plurality of memory modules according to embodiments of the present invention. The method of FIG. 3 is similar to the method of FIG. 2 in that the method of FIG. 3 also includes: detecting (202) a hardware configuration change upon initiating a boot sequence of a system (152) that includes the plurality of memory modules (168); generating (204) for a plurality of training iterations, reference training values corresponding to aligning of a data strobe (DQS) signal with a data valid window of data (DQ) lines of the plurality of memory modules; identifying (206) for each training iteration, any outer values within the reference training values generated for that training iteration; eliminating (208), the identified outer values from the reference training values; generating (210) a final reference training value based on an average of the remaining reference training values; and using (212) the final reference training value as the DQ-DQS timing value for the boot sequence of the system (152).

The method of FIG. 3 also includes generating (302), by the training controller (192), training values (360) upon initiation of a subsequent boot sequence. Training values are the values generated as a result of training in a subsequent boot sequence. That is, during a first boot sequence following a hardware change, reference training values are generated and during a subsequent boot sequence, training results in training values—not reference training values. Generating (302), by the training controller (192), training values upon initiation of a subsequent boot sequence may be carried out by receiving a plurality of DQS signals and a plurality of DQ signals; and comparing when the DQS signals are received relative to the corresponding DQ signals.

The method of FIG. 3 also includes determining (304), by the training controller (192), whether the training values (360) are within acceptable limits (370) of the final reference training value (268). Acceptable limits may indicate a high and low value. The high and low value of the acceptable limits may be set so that each value is a particular amount more or less than the final reference training value (268).

Determining (304), by the training controller (192), whether the training values (360) are within acceptable limits (370) of the final reference training value (268) may be carried out by determining a value difference between the final reference training value and each of the training values; if the value difference exceeds a predetermined value, then store an indication that the training values are not within acceptable limits; and if the value difference does not exceed the predetermined value, then store an indication that the training values are within the acceptable limits.

The method of FIG. 3 also includes if the training values are within the acceptable limits, using (306), by the training controller (192), the final reference training value (268) as the DQ-DQS timing value (270) in the subsequent boot sequence. Using (306), by the training controller (192), the final reference training value (268) as the DQ-DQS timing value (270) in the subsequent boot sequence may be carried out by using the final reference training value (268) to set a delay-locked loop that controls the read operation of the one or more of the memory modules (168).

The method of FIG. 3 also includes if the training values are not within the acceptable limits, using (308), by the training controller (192), an average (362) of the training values as the DQ-DQS timing value (270). Using (308), by the training controller (192), an average (362) of the training values as the DQ-DQS timing value (270) may be carried out by generating an average of the training values and using the average to set a delay-locked loop that controls the read operation of the one or more of the memory modules (168).

Figure 4:
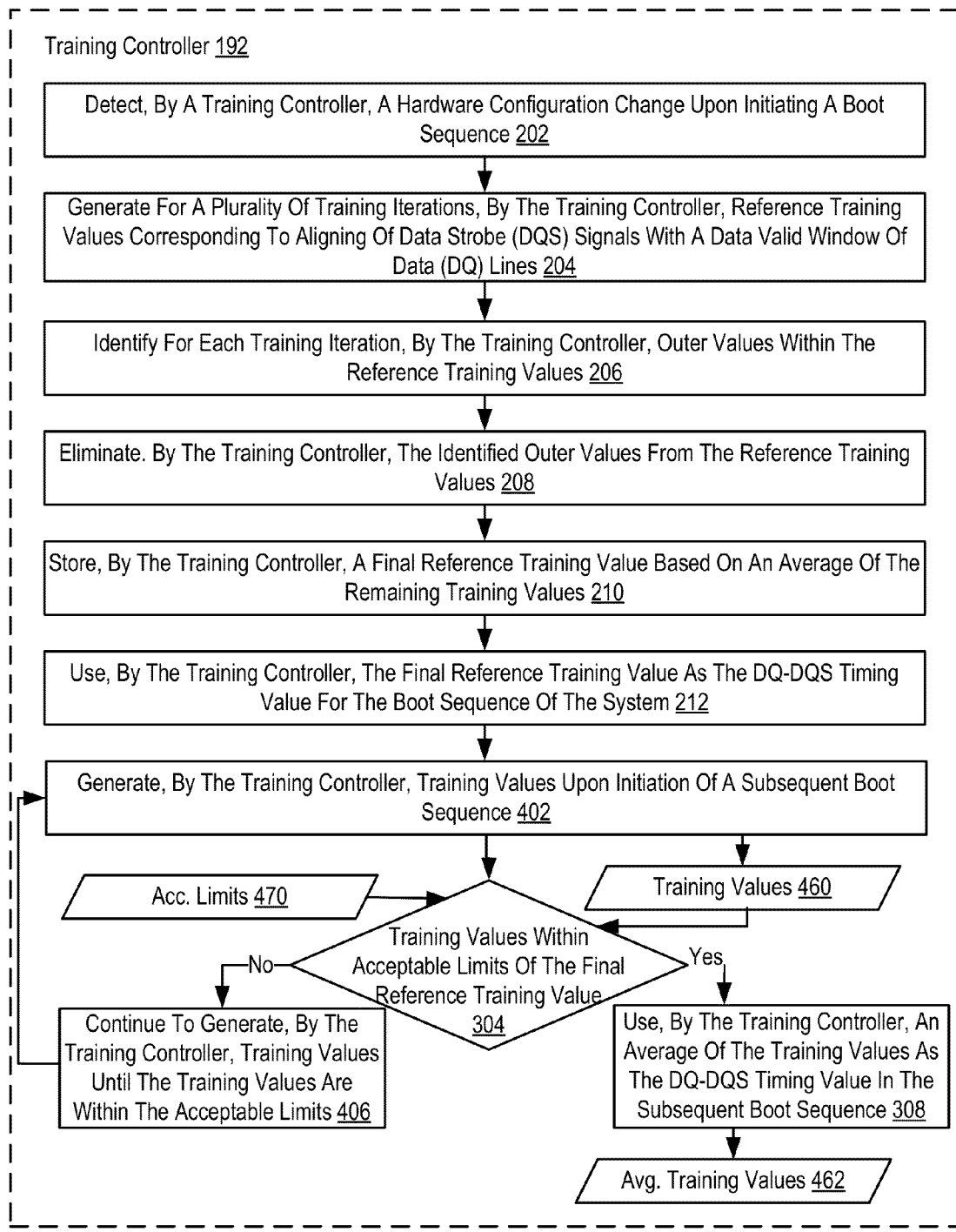
FIG. 4 sets forth a flow chart illustrating a further exemplary method for improving memory training results corresponding to a plurality of memory modules according to embodiments of the present invention.

FIG. 4 sets forth a flow chart illustrating a further exemplary method for improving memory training results corresponding to a plurality of memory modules according to embodiments of the present invention. The method of FIG. 4 is similar to the method of FIG. 2 in that the method of FIG. 4 also includes: detecting (202) a hardware configuration change upon initiating a boot sequence of a system (152) that includes the plurality of memory modules (168); generating (204) for a plurality of training iterations, reference training values corresponding to aligning of a data strobe (DQS) signal with a data valid window of data (DQ) lines of the plurality of memory modules; identifying (206) for each training iteration, any outer values within the reference training values generated for that training iteration; eliminating (208), the identified outer values from the reference training values; generating (210) a final reference training value based on an average of the remaining reference training values; and using (212) the final reference training value as the DQ-DQS timing value for the boot sequence of the system (152).

The method of FIG. 4 also includes generating (402), by the training controller (192), training values (460) upon initiation of a subsequent boot sequence. Generating (402), by the training controller (192), training values (460) upon initiation of a subsequent boot sequence may be carried out by receiving a plurality of DQS signals and a plurality of DQ signals; and comparing when the DQS signals are received relative to the corresponding DQ signals.

The method of FIG. 4 also includes determining (404), by the training controller (192), whether the training values (460) are within acceptable limits (470) of the final reference training value (268). Acceptable limits may indicate a high and low value. The high and low value of the acceptable limits may be set so that each value is a particular amount more or less than the final reference training value (268). Determining (404), by the training controller (192), whether the training values (460) are within acceptable limits (470) of the final reference training value (268) may be carried out by determining a value difference between the final reference training value and each of the training values; if the value difference exceeds a predetermined value, then store an indication that the training values are not within acceptable limits; and if the value difference does not exceed the predetermined value, then store an indication that the training values are within the acceptable limits.

The method of FIG. 4 also includes if the training values (460) are within the acceptable limits (470), continuing to generate (406), by the training controller (192), the training values (460) until the training values (460) are within the acceptable limits (470). Continuing to generate (406), by the training controller (192), the training values (460) until the training values (460) are within the acceptable limits (470) may be carried out by re-performing training to generate new training values; and comparing the new training values to the acceptable limits.

The method of FIG. 4 also includes if the training values (460) are not within the acceptable limits (470), using (408), by the training controller (192), an average (462) of the training values as the DQ-DQS timing value (270). Using (408), by the training controller (192), an average (462) of the training values as the DQ-DQS timing value (270) may be carried out by generating an average of the training values and using the average to set a delay-locked loop that controls the read operation of the one or more of the memory modules (168).

Figure 5:
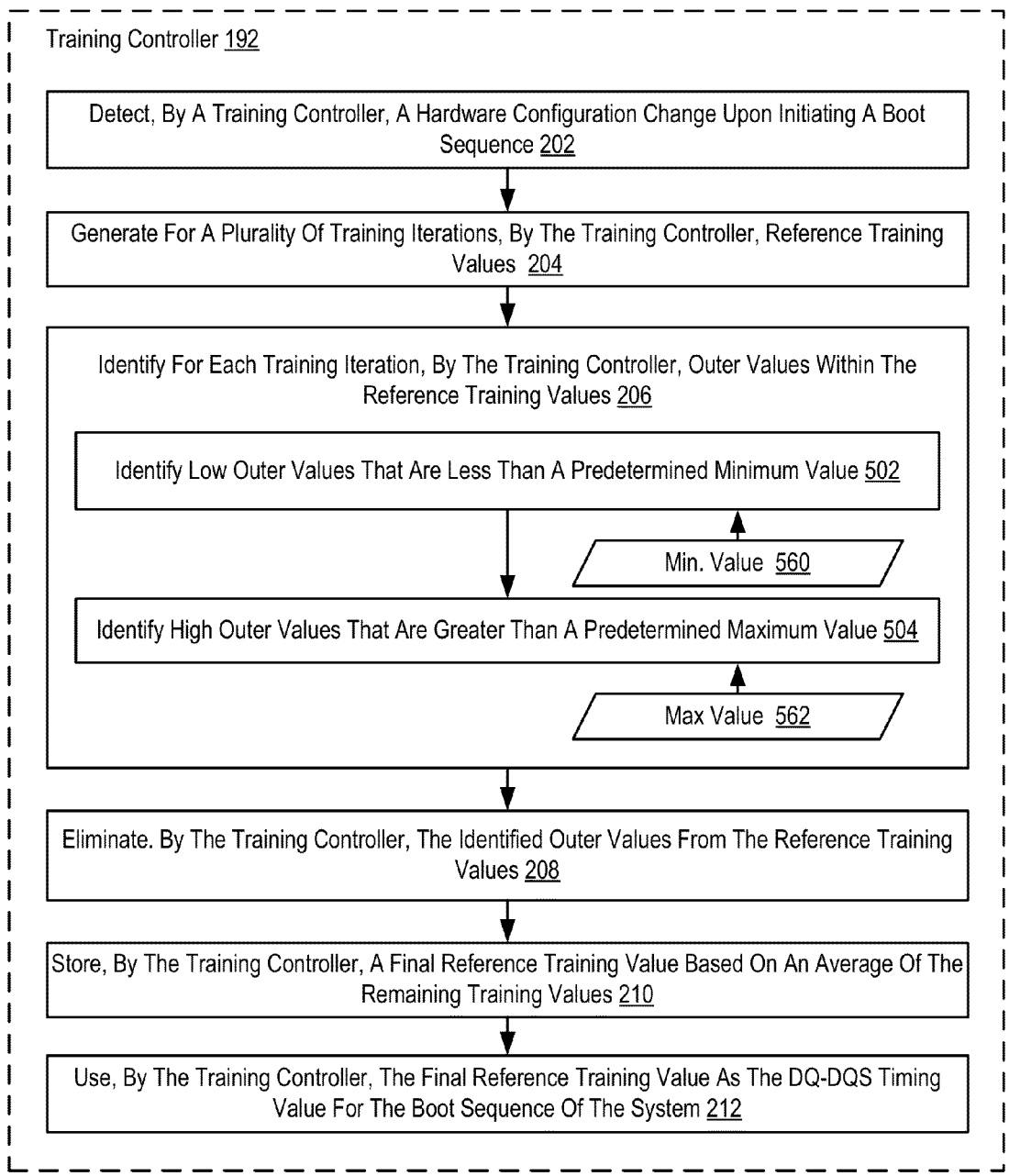
FIG. 5 sets forth a flow chart illustrating a further exemplary method for improving memory training results corresponding to a plurality of memory modules according to embodiments of the present invention.

FIG. 5 sets forth a flow chart illustrating a further exemplary method for improving memory training results corresponding to a plurality of memory modules according to embodiments of the present invention. The method of FIG. 5 is similar to the method of FIG. 2 in that the method of FIG. 5 also includes: detecting (202) a hardware configuration change upon initiating a boot sequence of a system (152) that includes the plurality of memory modules (168); generating (204) for a plurality of training iterations, reference training values corresponding to aligning of a data strobe (DQS) signal with a data valid window of data (DQ) lines of the plurality of memory modules; identifying (206) for each training iteration, any outer values within the reference training values generated for that training iteration; eliminating (208), the identified outer values from the reference training values; generating (210) a final reference training value based on an average of the remaining reference training values; and using (212) the final reference training value as the DQ-DQS timing value for the boot sequence of the system (152).

In the method of FIG. 5, however, identifying (206) for each training iteration, any outer values within the reference training values generated for that training iteration includes identifying (502) low outer values that are less than a predetermined minimum value (560). Identifying (502) low outer values that are less than a predetermined minimum value (560) may be carried out by comparing each reference training value to a predetermined minimum value; and if the reference training value is less than the predetermined minimum value, indicating that the reference training is a low outer value.

In the method of FIG. 5, however, identifying (206) for each training iteration, any outer values within the reference training values generated for that training iteration includes identifying (504) high outer values that are greater than a predetermined maximum value (562). Identifying (504) high outer values that are greater than a predetermined maximum value (562) may be carried out by comparing each reference training value to a predetermined maximum value and if the reference training value is greater than the predetermined maximum value, indicating that the reference training is a high outer value.

Figure 6:
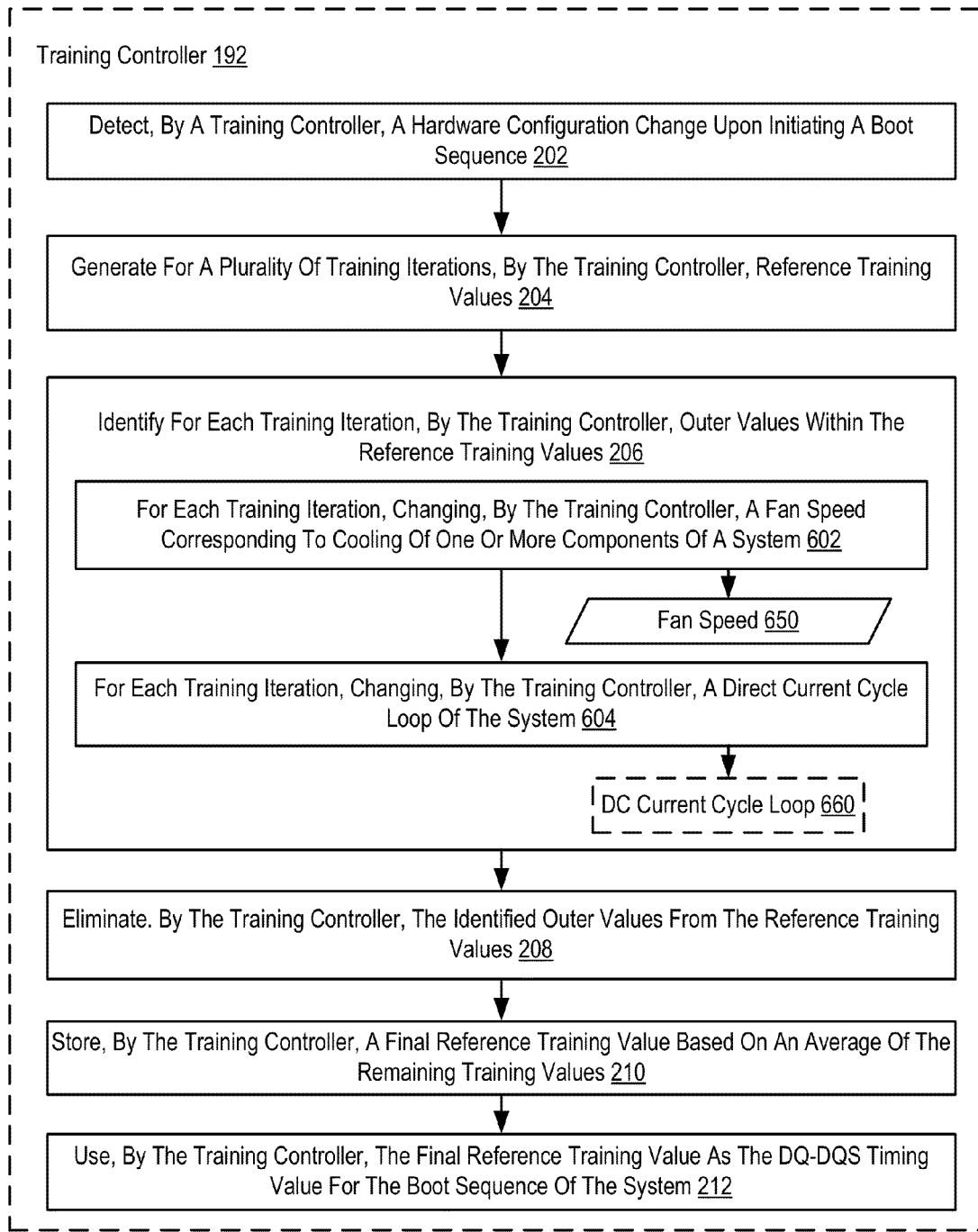
FIG. 6 sets forth a flow chart illustrating a further exemplary method for improving memory training results corresponding to a plurality of memory modules according to embodiments of the present invention.

FIG. 6 sets forth a flow chart illustrating a further exemplary method for improving memory training results corresponding to a plurality of memory modules according to embodiments of the present invention. The method of FIG. 6 is similar to the method of FIG. 2 in that the method of FIG. 6 also includes: detecting (202) a hardware configuration change upon initiating a boot sequence of a system (152) that includes the plurality of memory modules (168); generating (204) for a plurality of training iterations, reference training values corresponding to aligning of a data strobe (DQS) signal with a data valid window of data (DQ) lines of the plurality of memory modules; identifying (206) for each training iteration, any outer values within the reference training values generated for that training iteration; eliminating (208), the identified outer values from the reference training values; generating (210) a final reference training value based on an average of the remaining reference training values; and using (212) the final reference training value as the DQ-DQS timing value for the boot sequence of the system (152).

In the method of FIG. 6, however, identifying (206) for each training iteration, any outer values within the reference training values generated for that training iteration includes for each training iteration, changing (602), by the training controller (192), a fan speed (650) corresponding to cooling of one or more components of the system (152) that includes the plurality of memory modules (168). Changing a fan speed may impact the overall temperature of a computer and thus impact the DQ-DQS timing of a DLL. That is, changing the fan speed can introduce platform variation that is useful in generating more precise reference training values. Changing (602), by the training controller (192), a fan speed (650) corresponding to cooling of one or more components of the system (152) that includes the plurality of memory modules (168) may be carried out by increasing or reducing the fan speed.

In the method of FIG. 6, identifying (206) for each training iteration, any outer values within the reference training values generated for that training iteration includes for each training iteration, changing (604), by the training controller (192), a direct current cycle loop (660) of the system (152) that includes the plurality of memory modules (168). A DC cycle loop impacts the power cycle of one or more components of a system, such as the memory modules (168). Changing the DC cycle loop may introduce platform variation that is useful in generating more precise reference training values. Changing (604), by the training controller (192), a direct current cycle loop (660) of the system (152) that includes the plurality of memory modules (168) may be carried out by changing one or more parameters associated with the DC cycle loop of the system.

Exemplary embodiments of the present invention are described largely in the context of a fully functional computer system for improving memory training results corresponding to a plurality of memory modules. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of improving memory training results corresponding to a plurality of memory modules, the method comprising:
   detecting, by a training controller, a hardware configuration change upon initiating a boot sequence of a system that includes the plurality of memory modules;
   generating for a plurality of training iterations, by the training controller, reference training values corresponding to aligning of a data strobe (DQS) signal with a data valid window of data (DQ) lines of the plurality of memory modules;
   identifying for each training iteration, by the training controller, any outer values within the reference training values generated for that training iteration;
   eliminating, by the training controller, the identified outer values from the reference training values;
   generating, by the training controller, a final reference training value based on an average of the remaining reference training values; and
   using, by the training controller, the final reference training value as the DQ-DQS timing value for the boot sequence of the system.

2. The method of claim 1 further comprising:
   generating, by the training controller, training values upon initiation of a subsequent boot sequence;
   determining, by the training controller, whether the training values are within acceptable limits of the final reference training value;
   if the training values are within the acceptable limits, using, by the training controller, the final reference training value as the DQ-DQS timing value in the subsequent boot sequence; and
   if the training values are not within the acceptable limits, using, by the training controller, an average of the training values as the DQ-DQS timing value in the subsequent boot sequence.

3. The method of claim 1 further comprising:
   generating, by the training controller, training values upon initiation of a subsequent boot sequence;
   determining, by the training controller, whether the training values are within acceptable limits of the final reference training value;
   if the training values are within the acceptable limits, continuing to generate, by the training controller, the training values until the training values are within the acceptable limits; and
   if the training values are not within the acceptable limits, using, by the training controller, an average of the training values as the DQ-DQS timing value in the subsequent boot sequence.

4. The method of claim 1 wherein identifying for each training iteration, by the training controller, outer values within the reference training values includes:
   identifying low outer values that are less than a predetermined minimum value; and
   identifying high outer values that are greater than a predetermined maximum value.

5. The method of claim 1 further comprising for each training iteration, changing, by the training controller, a fan speed corresponding to cooling of one or more components of the system that includes the plurality of memory modules.

6. The method of claim 1 further comprising for each training iteration, changing, by the training controller, a direct current cycle loop of the system that includes the plurality of memory modules.

7. An apparatus for improving memory training results corresponding to a plurality of memory modules, the apparatus comprising a computer processor, a computer memory operatively coupled to the computer processor, the computer memory having disposed within it computer program instructions that when executed cause the apparatus to carry out the steps of:
   detecting, by a training controller, a hardware configuration change upon initiating a boot sequence of a system that includes the plurality of memory modules;
   generating for a plurality of training iterations, by the training controller, reference training values corresponding to aligning of a data strobe (DQS) signal with a data valid window of data (DQ) lines of the plurality of memory modules;
   identifying for each training iteration, by the training controller, any outer values within the reference training values generated for that training iteration;
   eliminating, by the training controller, the identified outer values from the reference training values;
   generating, by the training controller, a final reference training value based on an average of the remaining reference training values; and
   using, by the training controller, the final reference training value as the DQ-DQS timing value for the boot sequence of the system.

8. The apparatus of claim 7 further comprising computer program instructions that when executed cause the apparatus to carry out the steps of:
   generating, by the training controller, training values upon initiation of a subsequent boot sequence;
   determining, by the training controller, whether the training values are within acceptable limits of the final reference training value;
   if the training values are within the acceptable limits, using, by the training controller, the final reference training value as the DQ-DQS timing value; and
   if the training values are not within the acceptable limits, using, by the training controller, an average of the training values as the DQ-DQS timing value.

9. The apparatus of claim 7 further comprising computer program instructions that when executed cause the apparatus to carry out the steps of:
   generating, by the training controller, training values upon initiation of a subsequent boot sequence;
   determining, by the training controller, whether the training values are within acceptable limits of the final reference training value;
   if the training values are within the acceptable limits, continuing to generate, by the training controller, the training values until the training values are within the acceptable limits; and
   if the training values are not within the acceptable limits, using, by the training controller, an average of the training values as the DQ-DQS timing value.

10. The apparatus of claim 7 wherein identifying for each training iteration, by the training controller, outer values within the reference training values includes:
    identifying low outer values that are less than a predetermined minimum value; and
    identifying high outer values that are greater than a predetermined maximum value.

11. The apparatus of claim 7 further comprising computer program instructions that when executed cause the apparatus to carry out the steps of for each training iteration, changing, by the training controller, a fan speed corresponding to cooling of one or more components of the system that includes the plurality of memory modules.

12. The apparatus of claim 7 further comprising computer program instructions that when executed cause the apparatus to carry out the steps of for each training iteration, changing, by the training controller, a direct current cycle loop of the system that includes the plurality of memory modules.

13. A computer program product for improving memory training results corresponding to a plurality of memory modules, the computer program product disposed upon a non-transitory computer readable medium, the computer program product comprising computer program instructions capable, when executed, of causing a computer to carry out the steps of:
   detecting, by a training controller, a hardware configuration change upon initiating a boot sequence of a system that includes the plurality of memory modules;
   generating for a plurality of training iterations, by the training controller, reference training values corresponding to aligning of a data strobe (DQS) signal with a data valid window of data (DQ) lines of the plurality of memory modules;
   identifying for each training iteration, by the training controller, any outer values within the reference training values generated for that training iteration;
   eliminating, by the training controller, the identified outer values from the reference training values;
   generating, by the training controller, a final reference training value based on an average of the remaining reference training values; and
   using, by the training controller, the final reference training value as the DQ-DQS timing value for the boot sequence of the system.

14. The computer program product of claim 13 further comprising computer program instructions capable, when executed, of causing a computer to carry out the steps of:
   generating, by the training controller, training values upon initiation of a subsequent boot sequence;
   determining, by the training controller, whether the training values are within acceptable limits of the final reference training value;
   if the training values are within the acceptable limits, using, by the training controller, the final reference training value as the DQ-DQS timing value; and
   if the training values are not within the acceptable limits, using, by the training controller, an average of the training values as the DQ-DQS timing value.

15. The computer program product of claim 13 further comprising computer program instructions capable, when executed, of causing a computer to carry out the steps of:
   generating, by the training controller, training values upon initiation of a subsequent boot sequence;
   determining, by the training controller, whether the training values are within acceptable limits of the final reference training value;
   if the training values are within the acceptable limits, continuing to generate, by the training controller, the training values until the training values are within the acceptable limits; and
   if the training values are not within the acceptable limits, using, by the training controller, an average of the training values as the DQ-DQS timing value.

16. The computer program product of claim 13 wherein identifying for each training iteration, by the training controller, outer values within the reference training values includes:
   identifying low outer values that are less than a predetermined minimum value; and
   identifying high outer values that are greater than a predetermined maximum value.

17. The computer program product of claim 13 further comprising computer program instructions capable, when executed, of causing a computer to carry out the steps of for each training iteration, changing, by the training controller, a fan speed corresponding to cooling of one or more components of the system that includes the plurality of memory modules.

18. The computer program product of claim 13 further comprising computer program instructions capable, when executed, of causing a computer to carry out the steps of for each training iteration, changing, by the training controller, a direct current cycle loop of the system that includes the plurality of memory modules.

19. The computer program product of claim 13 wherein the computer readable medium is a storage medium.

* * * * *